(12) United States Patent
Arai et al.

(10) Patent No.: US 11,435,392 B2
(45) Date of Patent: Sep. 6, 2022

(54) INSPECTION METHOD AND INSPECTION SYSTEM

(71) Applicant: Kabushiki Kaisha Nihon Micronics, Tokyo (JP)

(72) Inventors: Osamu Arai, Tochigi (JP); Hiroshi Kamiya, Kanagawa (JP)

(73) Assignee: Kabushiki Kaisha Nihon Micronics, Tokyo (JP)

(*) Notice: Subject to any disclaimer, the term of this patent is extended or adjusted under 35 U.S.C. 154(b) by 19 days.

(21) Appl. No.: 17/275,626

(22) PCT Filed: Aug. 27, 2019

(86) PCT No.: PCT/JP2019/033429
§ 371 (c)(1),
(2) Date: Mar. 11, 2021

(87) PCT Pub. No.: WO2020/059440
PCT Pub. Date: Mar. 26, 2020

(65) Prior Publication Data
US 2022/0034959 A1  Feb. 3, 2022

(30) Foreign Application Priority Data
Sep. 21, 2018  (JP) .............................. JP2018-177401

(51) Int. Cl.
G01R 31/28  (2006.01)
G01R 31/265  (2006.01)
G01R 1/073  (2006.01)

(52) U.S. Cl.
CPC ..... *G01R 31/2656* (2013.01); *G01R 1/07342* (2013.01)

(58) Field of Classification Search
CPC .............. G01M 11/00; G01R 1/07342; G01R 31/2656; G01R 31/2884; G01R 31/2886;
(Continued)

(56) References Cited

U.S. PATENT DOCUMENTS 6,075,592 A  6/2000 Banerjee et al.
7,024,066 B1  4/2006 Malendevich et al.
(Continued)

FOREIGN PATENT DOCUMENTS

JP  2011242216 A  12/2011
JP  2017069428 A  4/2017
(Continued)

Primary Examiner — Jermele M Hollington
Assistant Examiner — Courtney G McDonnough
(74) Attorney, Agent, or Firm — Lorenz & Kopf, LLP

(57) ABSTRACT

An inspection method includes a step S20 of electrically connecting electrical signal terminals of a semiconductor device to electric connectors, and optically connecting optical signal terminals of the semiconductor device to optical connectors, a step S30 of measuring a test light output signal output from a monitoring element provided in an inspection object in response to a test input signal having been input to the monitoring element while adjusting conditions of a position and an inclination of the inspection object, and extracting conditions in which an optical intensity of the test light output signal is a predetermined determination value or greater as inspection conditions, and a step S40 of inspecting the semiconductor device under the inspection conditions.

18 Claims, 8 Drawing Sheets

(58) Field of Classification Search
CPC .............. G01R 31/2891; G01R 31/308; G01R 31/2887
USPC .................................................... 324/750.23
See application file for complete search history.

(56) References Cited

U.S. PATENT DOCUMENTS

| | | |
|---|---|---|
| 2002/0101581 A1* | 8/2002 | Murakawa ........... G01B 11/272 356/138 |
| 2006/0008226 A1 | 1/2006 | McCann et al. |
| 2006/0109015 A1* | 5/2006 | Thacker ................... G02B 6/12 324/755.07 |
| 2011/0279812 A1 | 11/2011 | Masuda |
| 2018/0088149 A1 | 3/2018 | Fisher et al. |
| 2018/0259848 A1 | 9/2018 | Grimbergen et al. |
| 2018/0275192 A1 | 9/2018 | Yamada |

FOREIGN PATENT DOCUMENTS

| | | |
|---|---|---|
| KR | 20130042225 A | 4/2013 |
| TW | 201316010 A | 4/2013 |
| TW | 201316014 A | 4/2013 |
| TW | 201814300 A | 4/2018 |

* cited by examiner

INSPECTION METHOD AND INSPECTION SYSTEM

TECHNICAL FIELD

The present invention relates to an inspection method and an inspection system used for inspecting characteristics of an inspection object.

BACKGROUND ART

A semiconductor device including an electric circuit to which electrical signals are transmitted and an optical circuit to which optical signals are transmitted (hereinafter referred to below as an "optical device") is formed on a silicon substrate, for example, by use of silicon photonics. To inspect the characteristics of the optical device in a wafer state, optical fibers are used that transmit optical signals.

For example, a method is disclosed that leads a tip of an optical fiber held by a probe body to come close to an inspection object so as to acquire the characteristics of the inspection object (refer to Patent Literature 1).

CITATION LIST

Patent Literature

PTL 1: U.S. Patent Application Publication No. US 2006/0008226A1

SUMMARY OF INVENTION

Technical Problem

The conventional inspection method does not sufficiently confirm the characteristics of optical signals output from the inspection object. The conventional inspection method still has a problem of ensuring a measurement accuracy required for the inspection.

In view of the foregoing problem, an object of the present invention is to provide an inspection method and an inspection system having an improved accuracy for measuring an inspection object provided with an optical device.

Solution to Problem

An inspection method according to an aspect of the present invention electrically connects an electrical signal terminal of a semiconductor device to an electric connector and optically connects an optical signal terminal of the semiconductor device to an optical connector, measures a test light output signal output from a monitoring element provided in an inspection object in response to a test input signal having been input to the monitoring element while adjusting a condition of a position and an inclination of the inspection object and extracts a condition in which an optical intensity of the test light output signal is a predetermined determination value or greater as an inspection condition, and inspects the semiconductor device under the inspection condition.

An inspection system according to another aspect of the present invention includes a probe card provided therein with a connector group including an electric connector electrically connected to an electrical signal terminal of a semiconductor device and an optical connector optically connected to an optical signal terminal of the semiconductor device, a prober on which an inspection object is mounted, the prober being configured to adjust a position and an inclination of the inspection object so that the connector group is connected to a signal terminal group of the semiconductor device, and a tester configured to inspect a characteristic of the semiconductor device in accordance with an electrical signal and an optical signal transmitted via the connector group. The inspection system measures a test light output signal output from a monitoring element provided in the inspection object in response to a test input signal having been input to the monitoring element while adjusting a condition of the position and the inclination of the inspection object by the prober and extracts a condition in which an optical intensity of the test light output signal is a predetermined determination value or greater as an inspection condition, and inspects the semiconductor device under the inspection condition.

Advantageous Effects of Invention

The present invention can provide the inspection method and the inspection system having an improved accuracy for measuring the inspection object provided with the optical device.

DESCRIPTION OF EMBODIMENTS

Figure 1:
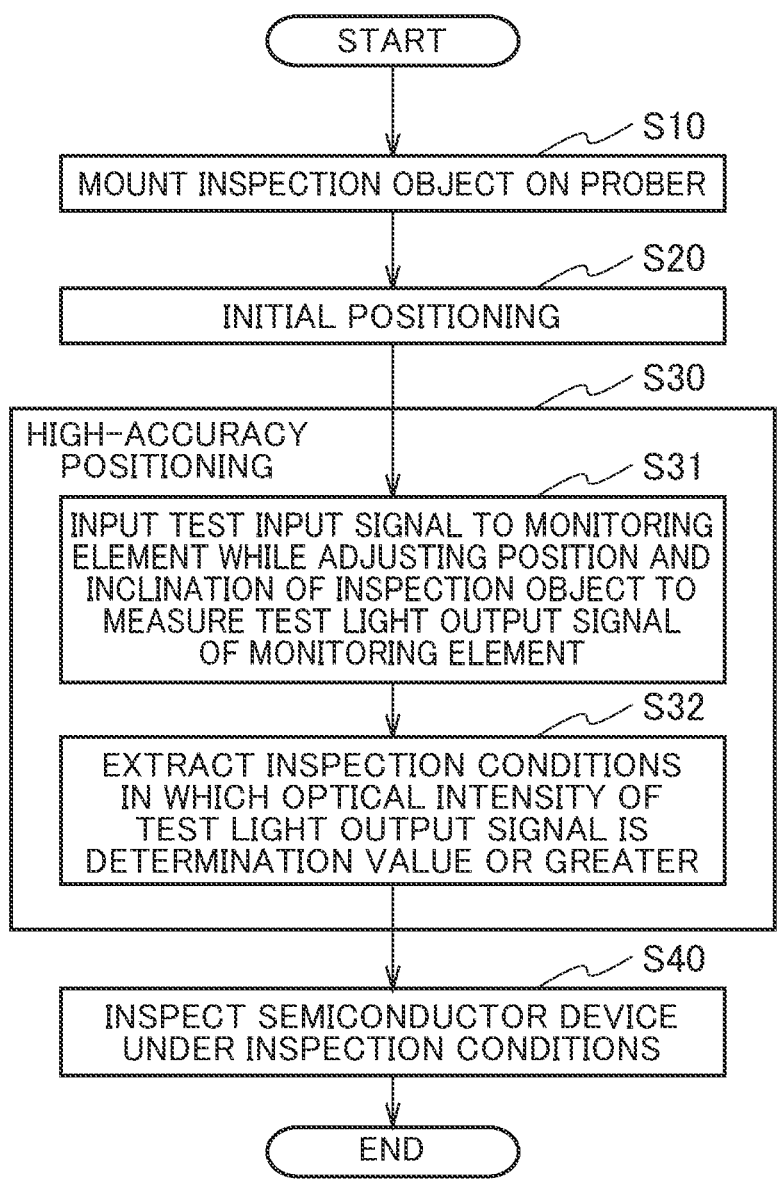
FIG. 1 is a flowchart for explaining an inspection method according to a first embodiment of the present invention.

Hereinafter, embodiments of the present invention will be described with reference to the drawings. The same or similar elements illustrated in the drawings are denoted by the same reference numerals. It should be understood that the drawings are illustrated schematically, and proportions of the thicknesses of the respective elements are not drawn to scale. It should also be understood that the relationships or proportions of the dimensions between the respective drawings can differ from each other. The embodiments described below illustrate a device and a method for embodying the technical ideas of the present invention, but the respective embodiments are not intended to be limited to the materials, shapes, structures, or arrangements of the constituent elements as described herein.

First Embodiment

An inspection method according to a first embodiment of the present invention is used for inspecting an inspection object provided with a semiconductor device (an optical device) including a signal terminal group including electrical signal terminals to which electrical signals are transmitted and optical signal terminals to which optical signals are transmitted. The inspection method according to the first embodiment includes a step S10 of mounting the inspection object on a prober, a step S20 of executing initial positioning, a step S30 of executing high-accuracy positioning, and a step S40 of inspecting the optical device, as shown in FIG. 1.

The "initial positioning" roughly aligns the signal terminals of the inspection object with connectors of an inspection system with a constant positioning accuracy. The "high-accuracy positioning" connects the signal terminals of the optical device and the connectors to each other with a higher positioning accuracy than the initial positioning so as to ensure a predetermined measurement accuracy.

Figure 2:
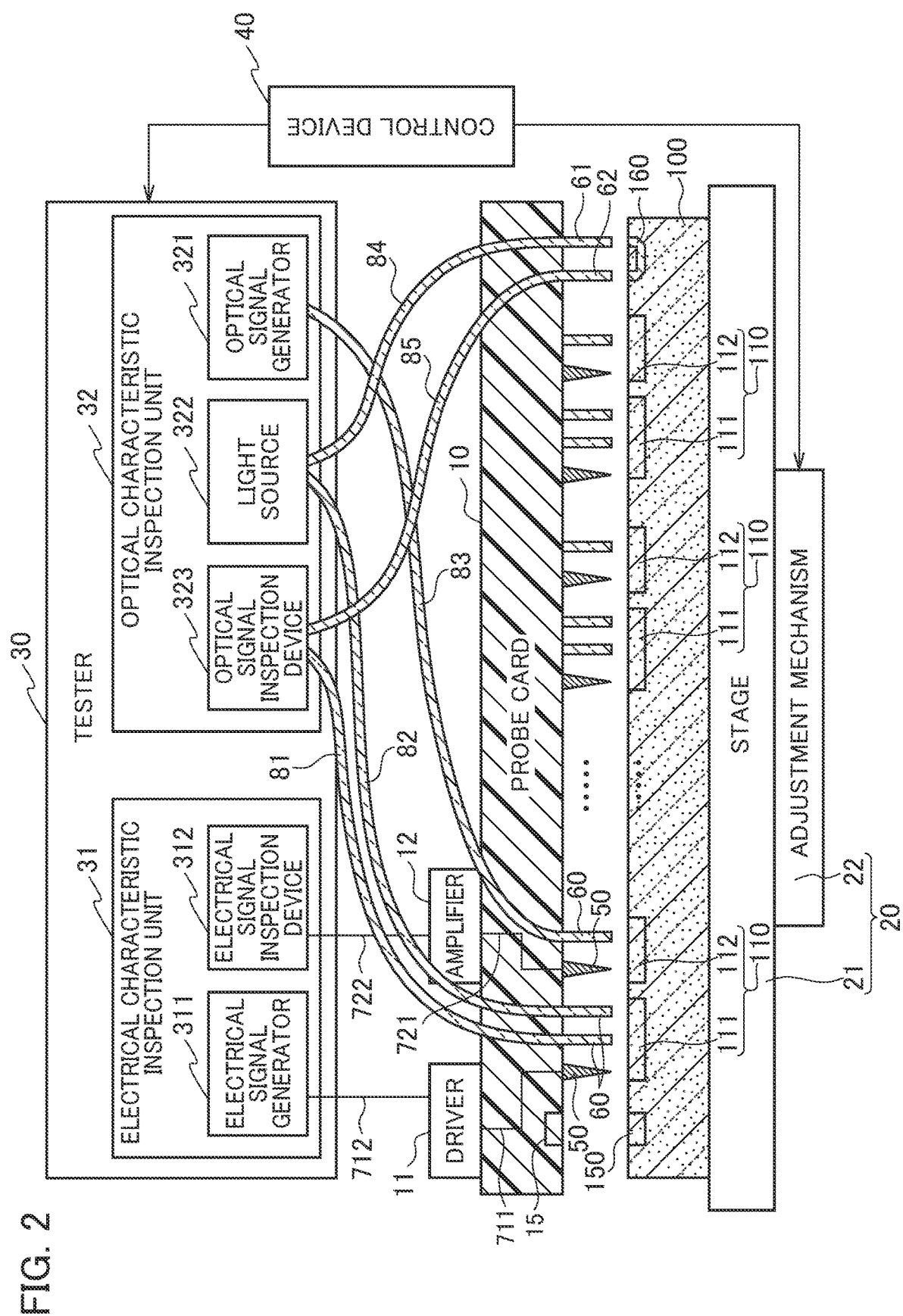
FIG. 2 is a schematic view illustrating a configuration of an inspection system according to the first embodiment of the present invention.

The inspection method according to the first embodiment can be executed by the inspection system as illustrated in FIG. 2, for example. The inspection system illustrated in FIG. 2 is described below before the specific explanations of the inspection method are made.

The inspection system as illustrated in FIG. 2 includes a probe card 10, a prober 20, a tester 30, and a control device 40, and is used for inspecting optical devices 110 provided on the inspection object 100 in a wafer state. FIG. 2 illustrates a case in which the optical devices 110 each include a light modulation element 111 that changes the properties such as a frequency or a phase of an incident light, and a light detection element 112 that detects the incident light.

The probe card 10 is provided therein with a plurality of connector groups each including electric connectors 50 and optical connectors 60. The electric connectors 50 are electrically connected to electrical signal terminals of the optical device 110 provided on the inspection object 100. The optical connectors 60 are optically connected to optical signal terminals of the optical device 110 so as to transmit optical signals between the optical device 110 and the optical connectors 60. The optical connection leads the optical signals to be transmitted between the optical signal terminals of the optical device 110 and the optical connectors 60. The optical signal terminals and the optical connectors 60 are usually not in contact with each other. For example, the optical signals are transmitted between the optical signal terminals of the optical device 110 and the optical connectors 60 that are arranged proximate to the optical signal terminals. The optical connectors 60 in contact with the optical signal terminals may be used instead.

Probes made of conductive material are preferably used for the electric connectors 50. For example, cantilever-type probes or probes of any other type are used for the electric connectors 50, and tips of the probes are connected to the electrical signal terminals of the optical device 110. Electric wires 711 and 721 connected to the electric connectors 50 are arranged inside the probe card 10.

Optical fibers and the like are used for the optical connectors 60. For example, optical fibers are used for optical waveguide components 81 to 83 penetrating the probe card 10. The tip ends of the optical fibers are subjected to terminal processing such as lens processing or grinding so as to serve as the optical connectors 60. The optical connectors 60 of which the tip ends are to be brought close to the optical signal terminals of the optical device 110 thus may be integrated with the optical waveguide components 81 to 83. Any other optical components having optical waveguides instead of the optical fibers can definitely be used for the optical connectors 60 or the optical waveguide components 81 to 83.

The probe card 10 illustrated in FIG. 2 further includes a card-side alignment mark 15, a test input connector 61, and a test output connector 62. The test input connector 61 and the test output connector 62 have the same configuration as the optical connectors 60. The test input connector 61 is connected to the tester 30 via an optical waveguide component 84, and the test output connector 62 is connected to the tester 30 via an optical waveguide component 85. The card-side alignment mark 15, the test input connector 61, and the test output connector 62 will be described in detail below.

The probe card 10 is provided thereon with a driver 11 that inputs an electrical signal to the optical device 110, and an amplifier 12 that amplifies the electrical signal output from the optical device 110.

The prober 20 includes a stage 21 on which the inspection object 100 is mounted, and an adjustment mechanism 22 that adjusts a position and an inclined angle of a mount surface of the stage 21 on which the inspection object 100 is mounted. The adjustment mechanism 22 adjusts a position and an inclination of the inspection object 100 mounted on the stage 21 so that each of the connector groups provided in the probe card 10 is connected to the signal terminal group of the optical device 110. The adjustment mechanism 22 has the function of adjusting a position (in an x-direction and a y-direction) at the same plane level as the mount surface of the stage 21, a height (in a z-direction), a rotation direction about a plane normal of the mount surface as a central axis, and an inclination of the mount surface.

The tester 30 inspects the characteristics of the optical device 110 according to the electrical signals and the optical signals transmitted via the connector group of the probe card 10. The tester 30 includes an electrical characteristic inspection unit 31 that inspects the electrical characteristics of the optical device 110, and an optical characteristic inspection unit 32 that inspects the optical characteristics of the optical device 110.

The electrical characteristic inspection unit 31 includes an electrical signal generator 311 that outputs an electrical signal necessary for the inspection, and an electrical signal inspection device 312 that inspects the electrical characteristics in accordance with the electrical signal.

The electrical signal generator 311 outputs a drive signal for driving the optical device 110. The drive signal is input to the driver 11 via an electric wire 712. The drive signal is further input to the electrical signal terminal of the optical device 110 from the driver 11 via the electric wire 711 and the electric connector 50.

An output signal output from the electrical signal terminal of the optical device 110 is input to the amplifier 12 via the electric connector 50 and the electric wire 721. The output signal amplified by the amplifier 12 is input to the electrical signal inspection device 312 via an electric wire 722. The electrical signal inspection device 312 inspects whether the output signal meets a predetermined standard value.

The optical characteristic inspection unit 32 includes an optical signal generator 321 that outputs an optical signal necessary for the inspection, a light source 322, and an optical signal inspection device 323 that inspects the optical characteristics in accordance with the optical signal. A light emitted from the light source 322 is input to the optical signal terminal of the optical device 110 via the optical waveguide component 82 and the optical connector 60. The light source 322 used is a light emitting diode (LED) or a semiconductor laser, for example. The optical signal generator 321 and the optical signal inspection device 323 are optically coupled with the optical signal terminals of the optical device 110 via the optical waveguide components 83 and 81 connected to the optical connectors 60. The optical signal inspection device 323 inspects whether the optical signal output from the optical signal terminal of the optical device 110 meets a predetermined standard value.

The tester 30 determines that the optical device 110 has a good quality when the inspection result obtained by the electrical signal inspection device 312 and the inspection result obtained by the optical signal inspection device 323 both meet the standard. A power meter, an ammeter, a voltmeter, or a far-field pattern (FFP) measurement device, for example, may be used as the tester 30 depending on the inspection contents.

The control device 40 controls the prober 20 and the tester 30. The adjustment mechanism 22 of the prober 20 is controlled by the control device 40 so that the connector group of the probe card 10 and the signal terminal group of the optical device 110 are connected to each other. The control device 40 controls the tester 30 to output the electrical signal and the optical signal, so as to evaluate the characteristics of the optical device 110 by the tester 30 in accordance with the electrical signal and the optical signal output from the optical device 110.

As illustrated in FIG. 2, the inspection object 100 is provided with a wafer-side alignment mark 150 and a monitoring element 160. As described below, the wafer-side alignment mark 150 is used for the initial positioning, and the monitoring element 160 is used for the high-accuracy positioning.

The inspection method for the inspection object 100 by use of the inspection system as illustrated in FIG. 2 is described below with reference to FIG. 1.

First, in step S10 shown in FIG. 1, the inspection object 100 is mounted on the mount surface of the stage 21 of the prober 20. In step S20, the initial positioning is then executed. The card-side alignment mark 15 and the wafer-side alignment mark 150 are detected by use of a positioning camera, for example. The adjustment mechanism 22 then adjusts the position of the stage 21 so as to align the wafer-side alignment mark 150 with the card-side alignment mark 15. The initial positioning thus can be executed through visual confirmation by use of an optical means, for example.

The initial positioning in step S20 leads the electric connectors 50 of the probe card 10 to be electrically connected to the electrical signal terminals of the optical device 110, and leads the optical connectors 60 of the probe card 10 to be optically connected to the optical signal terminals of the optical device 110. For example, the prober 20 adjusts the position and the inclination of the inspection object 100 such that the respective connector groups of the probe card 10 are connected to the corresponding signal terminal groups of the plural optical devices 110 provided on the inspection object 100.

In step S30, the high-accuracy positioning is executed. First, in step S31, a test input signal is input to the monitoring element 160 provided on the inspection object 100 while the position and the inclination of the inspection object 100 are adjusted, so that a test light output signal output from the monitoring element 160 is measured. In particular, the test input signal is input to the monitoring element 160 from the tester 30 via the optical waveguide component 84 and the test input connector 61. The test light output signal is then output from the monitoring element 160 in response to the test input signal. The test light output signal is input to the tester 30 via the test output connector 62 and the optical waveguide component 85.

Figure 3:
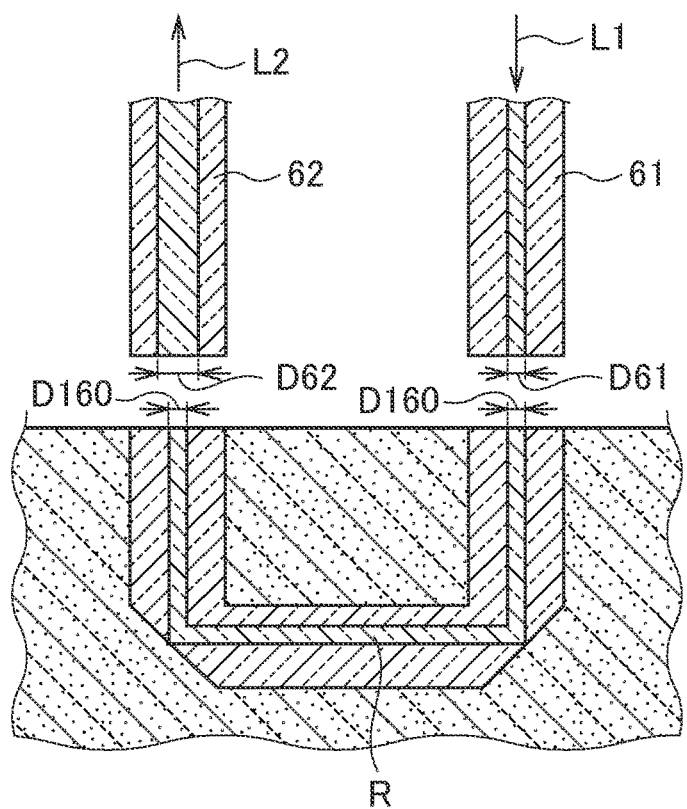
FIG. 3 is a schematic view showing an example of a monitoring element used for the inspection method according to the first embodiment of the present invention.

The monitoring element 160 has a configuration including an optical waveguide R as illustrated in FIG. 3, for example. The test input signal L1 of the optical signal output from the test input connector 61 is input to one end surface of the monitoring element 160. The test input signal L1 passes through the optical waveguide R, and the test light output signal L2 is then output from the other end surface of the monitoring element 160. The test light output signal L2 of the optical signal is received by the test output connector 62.

A core diameter D62 of the optical waveguide of the test output connector 62 is set to be sufficiently greater than a core diameter D160 of the optical waveguide R of the monitoring element 160. A core diameter D61 of the optical waveguide of the test input connector 61 only needs to be substantially equal to the core diameter D160 of the optical waveguide R.

An optical intensity of the test light output signal output from the monitoring element 160 is measured by the optical characteristic inspection unit 32. For example, the optical intensity of the test light output signal is measured by a power meter included in the optical signal inspection device 323. In step S31, the test light output signal is repeatedly measured several times while the conditions such as the position and the inclination of the inspection object 100 upon the connection with the connector group of the probe card 10 (referred to below as "connection conditions") are adjusted. The position and the inclination of the inspection object 100 are adjusted by the adjustment mechanism 22 of the prober 20 according to the control by the control device 40.

In step S32, the connection conditions in which the optical intensity of the test light output signal is a predetermined determination value or greater are extracted as inspection conditions. A method of extracting the inspection conditions will be descried below. The process then proceeds to step S40.

In step S40, the control device 40 controls the tester 30 to inspect the optical device 110 under the inspection conditions. The tester 30 may inspect the plural optical devices 110 simultaneously. The process ends accordingly.

Figure 4:
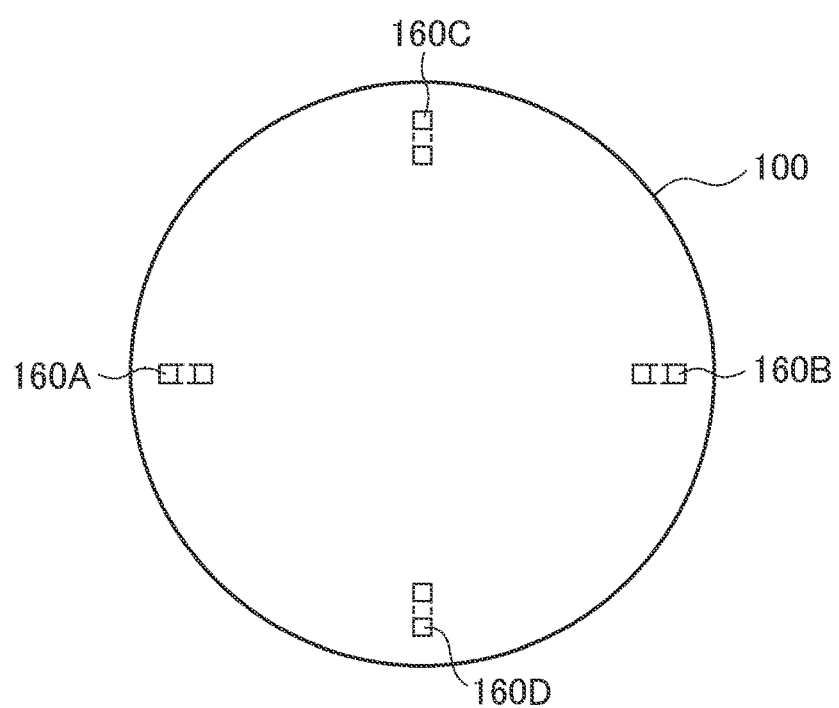
FIG. 4 is a schematic view for explaining an example of extracting inspection conditions by the inspection method according to the first embodiment of the present invention.

An example of the method of extracting the inspection conditions is described below. The example described herein is a method of executing the high-accuracy positioning by use of a plurality of monitoring elements 160 separately arranged at different positions. For example, as illustrated in FIG. 4, the four monitoring elements 160A to 160D are arranged on the respective lines perpendicular to each other on the inspection object 100 having a circular shape in a plan view.

The coordinates of the monitoring element 160A at a plane level (referred to below as "plane coordinates") parallel to the mount surface when the test light output signal is first measured is defined as the origin (0, 0) of the plane coordinates. In a case in which a tolerance of the adjustment of the adjustment mechanism 22 is defined as A in the x-direction and B in the y-direction, the test light output signal of the monitoring element 160A is measured with regard to the following eight plane coordinates: (+A, 0), (−A, 0), (0, +B), (0, −B), (+A, +B), (+A, −B), (−A, +B), and (−A, −B).

According to the measurement results regarding the nine coordinates including the origin (0, 0), the plane coordinates in which the test light output signal has the maximum intensity are determined as "optimum coordinates".

The test light output signal regarding the monitoring element 160B is next measured while the optimum coordinates are fixed. The test light output signal of the monitoring element 160B is measured under the following eight directional conditions, on the basis of the origin (0, 0) set as a directional condition upon the first measurement, in a case in which a tolerance of the rotation direction is defined as 0, and a tolerance of the inclination of the mount surface is defined as S regarding the adjustment of the adjustment mechanism 22: (0, 0), (+θ, 0), (−θ, 0), (0, +S), (0, −S), (+θ, +S), (+θ, −S), (−θ, +S), and (−θ, −S).

According to the measurement results under the nine directional conditions including the origin (0, 0), the directional condition in which the test light output signal has the maximum intensity is determined as an "optimum direction".

Subsequently, the test light output signal is measured in the optimum coordinates and in the optimum direction with regard to each of the monitoring element 160C and the monitoring element 160D. The measurement of the test light output signal with regard to each of the monitoring element 160C and the monitoring element 160D is made in the two directions in which the mount surface is inclined by +S and −S, on the basis of the axis connecting the monitoring element 160A and the monitoring element 160B. According to the measurement results of the three directions in total, the inclination in which the measurement results of the monitoring element 160C and the monitoring element 160D are equal to each other is determined as an "optimum inclination". The inspection conditions are thus extracted.

The present embodiment is illustrated above with the case in which the connection conditions in which the optical intensity of the test light output signal is maximum among the plural measurement results are extracted as the inspection conditions. Alternatively, the connection conditions in which the optical intensity of the test light output signal is a predetermined determination value or greater may be extracted as the inspection conditions. This extraction method is described below with reference to FIG. 5.

Figure 5:
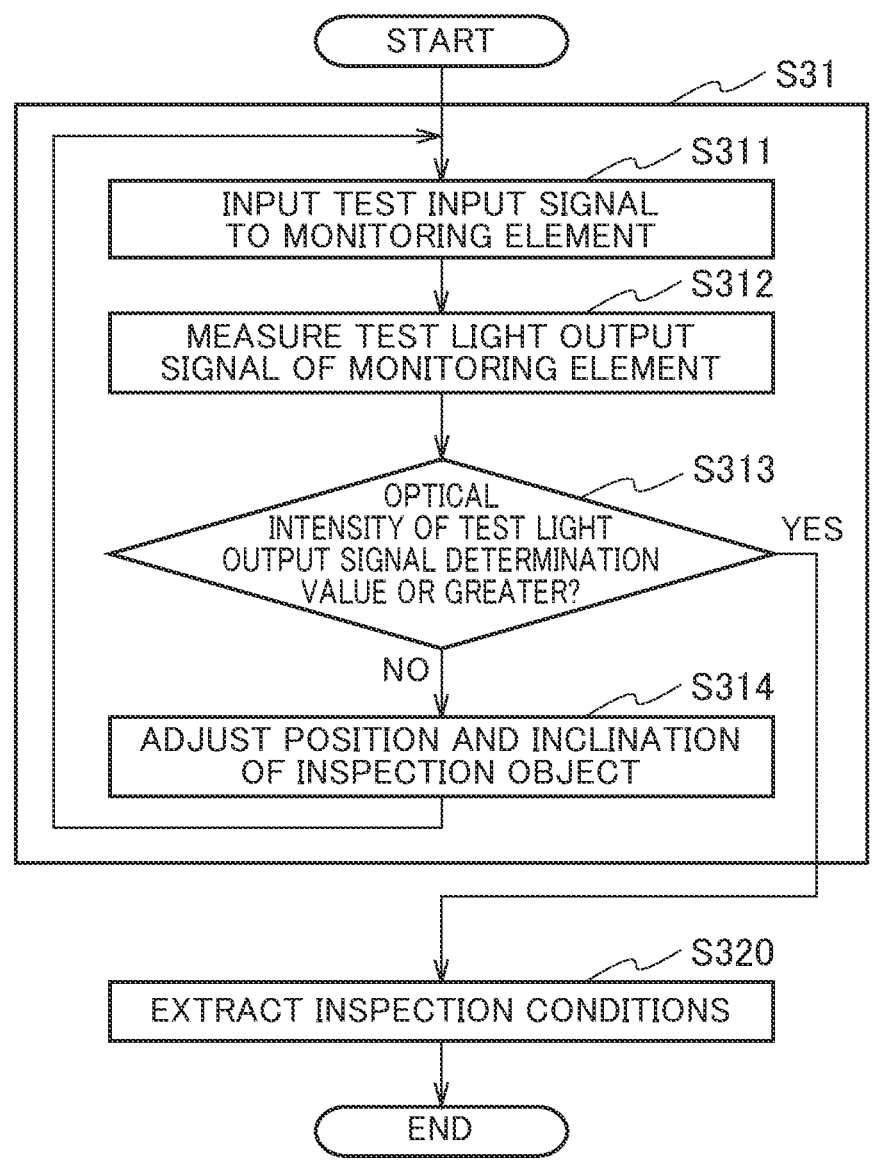
FIG. 5 is a flowchart for explaining another example of extracting inspection conditions by the inspection method according to the first embodiment of the present invention.

In step S31 shown in FIG. 5, the test input signal is input to the monitoring element 160 provided on the inspection object 100 in step S311. The test light output signal output from the monitoring element 160 in response to the test input signal is then input to the tester 30.

In step S312, the optical intensity of the test light output signal output from the monitoring element 160 is measured by the optical characteristic inspection unit 32. For example, the optical intensity of the test light output signal is measured by the power meter included in the optical signal inspection device 323.

In step S313, the optical characteristic inspection unit 32 determines whether the optical intensity of the test light output signal is the predetermined determination value or greater. The process proceeds to step S320 when the optical intensity is the determination value or greater.

When the optical intensity is lower than the determination value, the process proceeds to step S314, and the control device 40 controls the prober 20 to adjust the position and the inclination of the inspection object 100. The process then returns to step S311, and the test light output signal is then measured under new connection conditions.

In step S320 corresponding to step S32 in FIG. 1, the position and the inclination of the inspection object 100 when the optical intensity of the test light output signal is the predetermined determination value or greater are extracted as the inspection conditions. The process then proceeds to step S40 shown in FIG. 1.

The high-accuracy positioning as described with reference to FIG. 5 repeats the input of the test input signal and the determination of the optical intensity of the test light output signal while adjusting the position and the inclination of the inspection object 100 until the optical intensity of the test light output signal output from the monitoring element 160 reaches the predetermined determination value or greater. The determination value for the optical intensity of the test light output signal is set so as to obtain the measurement results with a measurement accuracy necessary for the inspection. The connection conditions in which the maximum intensity is obtained among the optical intensities of the determination value or greater can definitely be used as the inspection conditions.

As described above, the inspection method by use of the inspection system as illustrated in FIG. 2 repeats the measurement of the test light output signal while varying the connection conditions when connecting the connector group of the probe card 10 and the inspection object 100 upon the high-accuracy positioning so as to find out the inspection conditions. The inspection is then performed on the optical device 110 of the inspection object 100 under the inspection conditions. This can achieve the inspection regarding the optical device 110 with a high measurement accuracy.

The present embodiment is illustrated above with the case in which the monitoring element 160 is the optical waveguide. The monitoring element 160 is not necessarily limited to the simple optical waveguide. For example, the monitoring element 160 may be used that receives the electrical signal or the optical signal, or both the electrical signal and the optical signal input thereto and outputs the optical signal. In particular, at least either the electrical characteristic inspection unit 31 or the optical characteristic inspection unit 32 inputs the test input signal to the monitoring element 160. The optical characteristic inspection unit 32 then inspects the optical intensity of the test light output signal output from the monitoring element 160.

Figure 6:
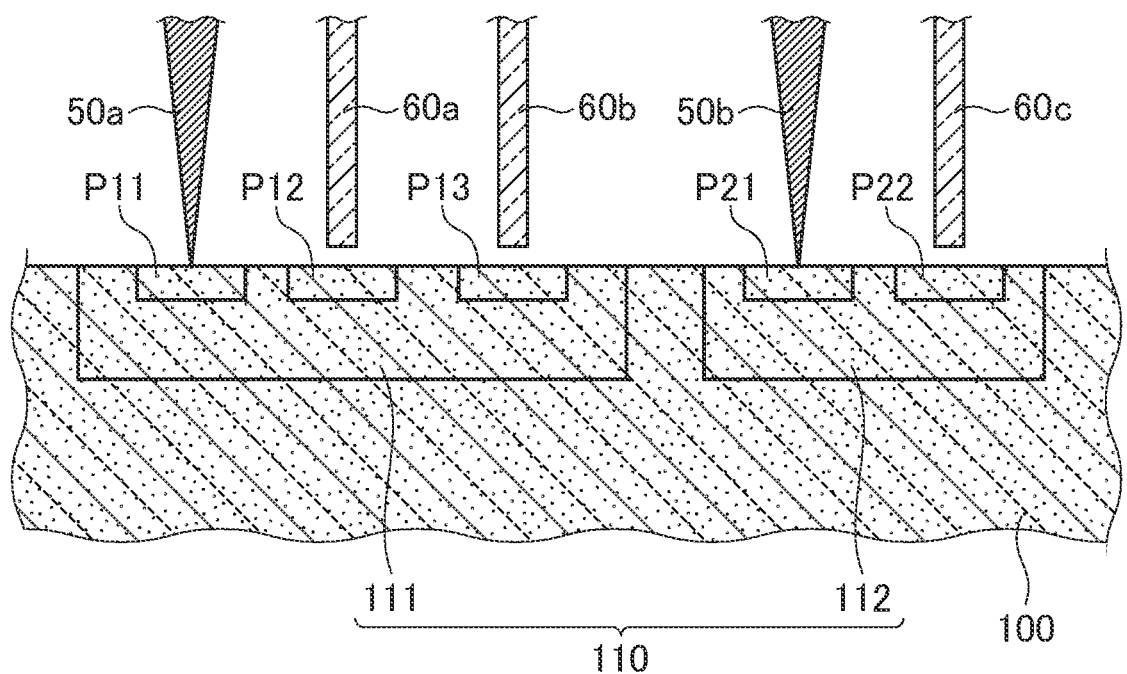
FIG. 6 is a schematic view for explaining an example of a method of inspecting an optical device by the inspection system according to the first embodiment of the present invention.

An example of the inspection method for the light modulation element 111 is described below with reference to FIG. 6. The electrical signal output from the electrical signal generator 311 is input to the driver 11, and a continuous oscillation light from the light source 322 is then input to the optical signal terminal P13 of the light modulation element 111 via the optical connector 60b. At the same time, the drive signal from the driver 11 is input to the electrical signal terminal P11 of the light modulation element 111 via the electric connector 50a.

An optical-intensity modulation signal light output from the optical signal terminal P12 of the light modulation element 111 in response to the input described above is input to the tester 30 via the optical connector 60a. The optical signal inspection device 323 then inspects the optical characteristics of the optical-intensity modulation signal light.

For example, a light modulation level, an insertion loss, a modulation band, an extinction ratio, and a wavelength chirp are inspected. A modulation level measurement device, an optical oscilloscope, or the like is used as the optical signal inspection device 323.

The inspection of the light detection element 112 is executed as follows, for example. The optical signal output from the optical signal generator 321 is input to the optical signal terminal P22 of the light detection element 112 via the optical connector 60c as illustrated in FIG. 6. The electrical signal output from the electrical signal terminal P21 of the light detection element 112 in response to the input of the optical signal is input to the amplifier 12 via the electric connector 50b. The electrical signal amplified by the amplifier 12 is input to the electrical signal inspection device 312 so as to inspect the electrical characteristics of the light detection element 112. For example, a dark current, light reception sensitivity (a photocurrent), a response speed, directional characteristics, spectral sensitivity characteristics, irradiation intensity/relative photocurrent characteristics, and collector-emitter voltage/current characteristics are inspected.

As described above, the inspection method according to the first embodiment executes the high-accuracy positioning by use of the monitoring element 160. The inspection method can connect all of the electrical signal terminals and the optical signal terminals of the optical device 110 provided on the inspection object 100 to the connector group of the probe card 10 with a high positioning accuracy. This can obtain the light output signal having the predetermined optical intensity so as to improve the measurement accuracy of the inspection object 100 provided with the optical device 110. The inspection system as illustrated in FIG. 2 can simultaneously inspect the plural optical devices 110 provided on the inspection object 100. The simultaneous inspection can greatly reduce the inspection time to improve the inspection efficiency.

Figure 7:
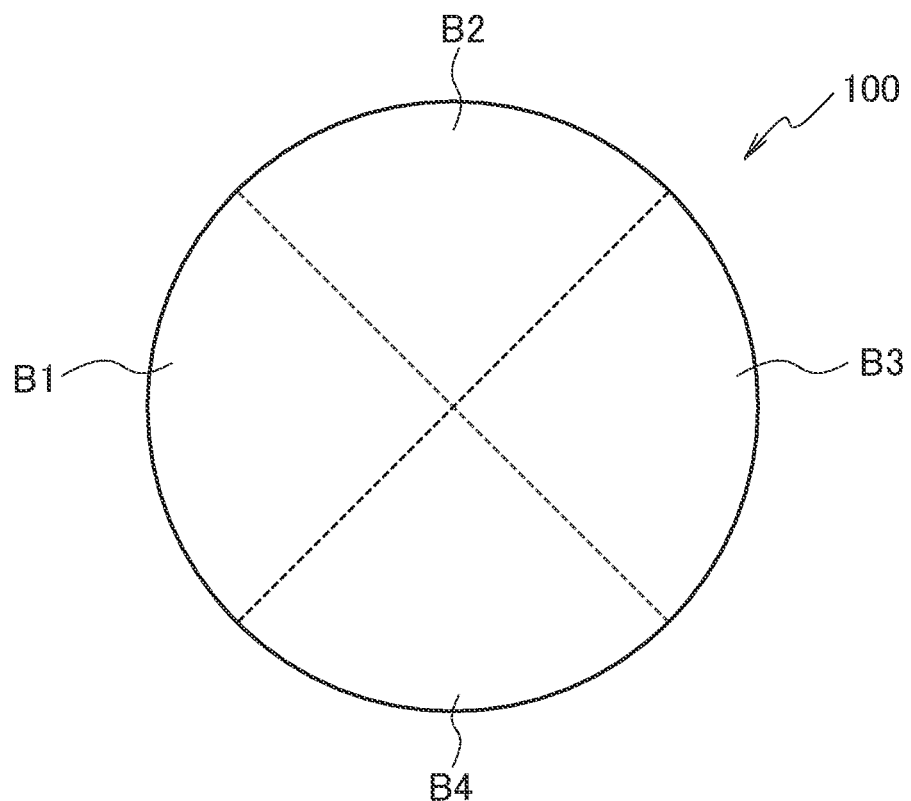
FIG. 7 is a schematic plan view of an inspection object for explaining a modified example of the inspection method according to the first embodiment of the present invention.

Each of the optical devices 110 may be inspected independently, or all of the optical devices 110 provided on the inspection object 100 may be inspected simultaneously. Alternatively, the inspection object 100 may be divided into plural areas so as to separately measure the optical devices 110 provided in each area. For example, as illustrated in FIG. 7, the inspection object 100 is divided into four blocks B1 to B4, and the monitoring element 160 is arranged in each of the blocks B1 to B4. The optical devices 110 are then inspected separately in each of the blocks B1 to B4.

Figure 8:
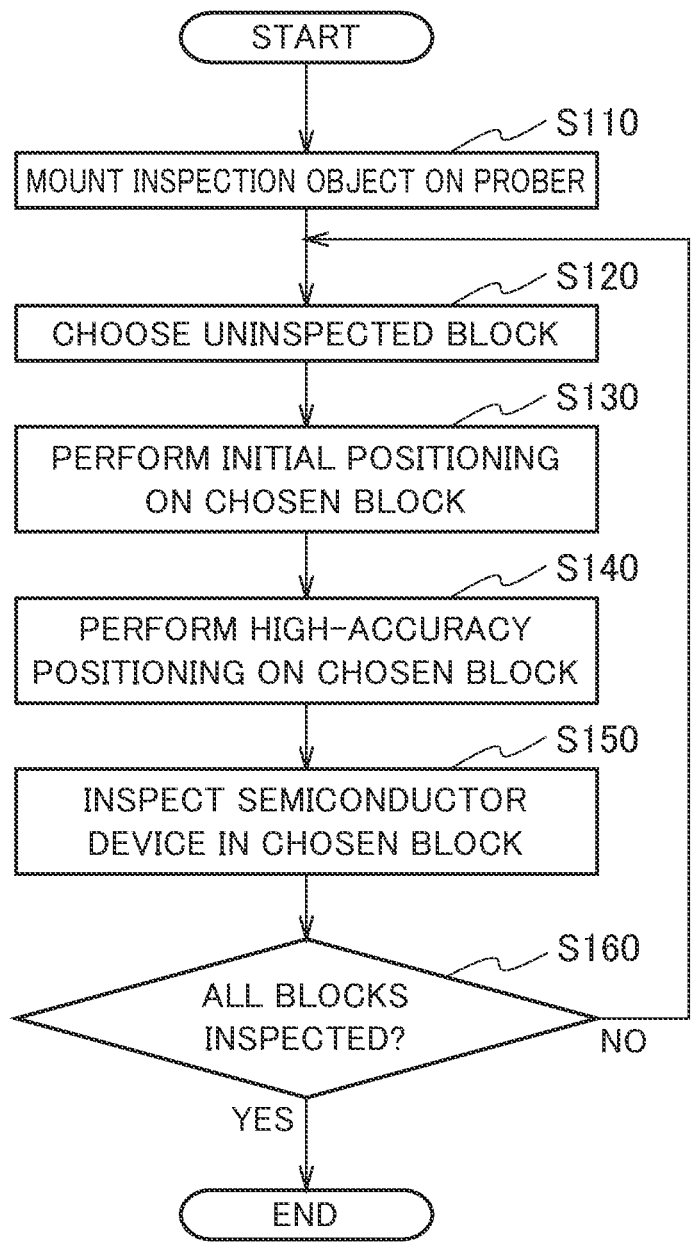
FIG. 8 is a flowchart for explaining the inspection method for the inspection object illustrated in FIG. 7.

An example of the inspection method for the inspection object 100 illustrated in FIG. 7 is described below with reference to FIG. 8. First, in step S110, the inspection object 100 is mounted on the stage 21 of the prober 20. The block not inspected yet is then chosen from the plural blocks in step S120, and the chosen block is subjected to the initial positioning in step S130 in the same manner as step S20 shown in FIG. 1.

In step S140, the chosen block is then subjected to the high-accuracy positioning by the method as described in step S30 shown in FIG. 1. After the high-accuracy positioning, the optical devices 110 in the chosen block are inspected in step S150.

In step S160, all of the blocks are determined whether to be inspected. The process returns to step S120 when there is any block not inspected yet. The process ends when all of the blocks have been inspected.

Modified Example

Figure 9:
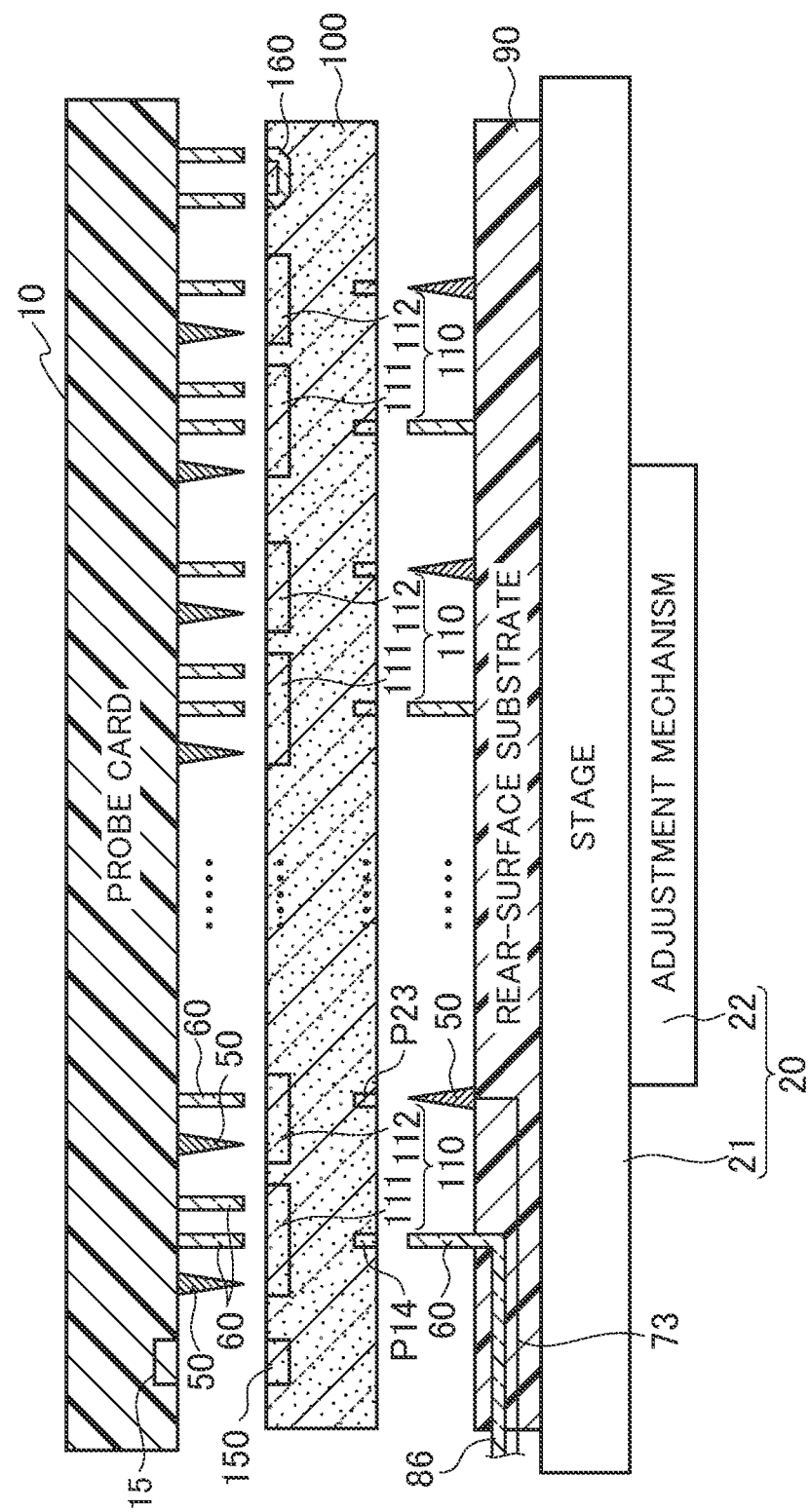
FIG. 9 is a schematic view illustrating a configuration of an inspection system according to a modified example of the first embodiment of the present invention.

The embodiment described above is illustrated with the case of inspecting the inspection object 100 provided with the signal terminals only on the front surface opposed to the probe card 10. In a case of inspecting the inspection object 100 provided with the signal terminals further on the rear surface opposed to the prober 20 as illustrated in FIG. 9, the electric connectors 50 and the optical connectors 60 are arranged on the mount surface of the prober 20. In particular, a rear-surface substrate 90 provided thereon with the optical connectors 60 and the electric connectors 50 to be connected to the optical signal terminals P14 and the electrical signal terminals P23 provided on the rear surface of the inspection object 100 is arranged on the top surface of the stage 21.

An electric wire 73 and an optical waveguide component 86 connected to the electric connector 50 and the optical connector 60 provided in the rear-surface substrate 90 are arranged inside the rear-surface substrate 90. Although not illustrated, the electric wire 73 and the optical waveguide component 86 are connected to the tester 30. The inspection system illustrated in FIG. 9 differs from the inspection system illustrated in FIG. 2 in that the rear-surface substrate 90 is arranged on the top surface of the stage 21.

The inspection method by use of the inspection system as illustrated in FIG. 9 aligns the signal terminal group provided on the rear surface of the optical device 110 with the connector group arranged on the mount surface of the prober 20, and mounts the inspection object 100 on the prober 20. The signal terminal group on the front surface of the optical device 110 is then aligned with the connector group arranged in the probe card 10 so as to inspect the optical device 110 by the method as described with reference to FIG. 1.

Second Embodiment

The first embodiment is illustrated above with the case in which the monitoring element 160 is provide on the inspection object 100 in a remaining part of the region in which the optical devices 110 are provided. Alternatively, the semiconductor device chosen from the plural optical devices 110 provided on the inspection object 100 may be used as the monitoring element as described below.

Figure 10:
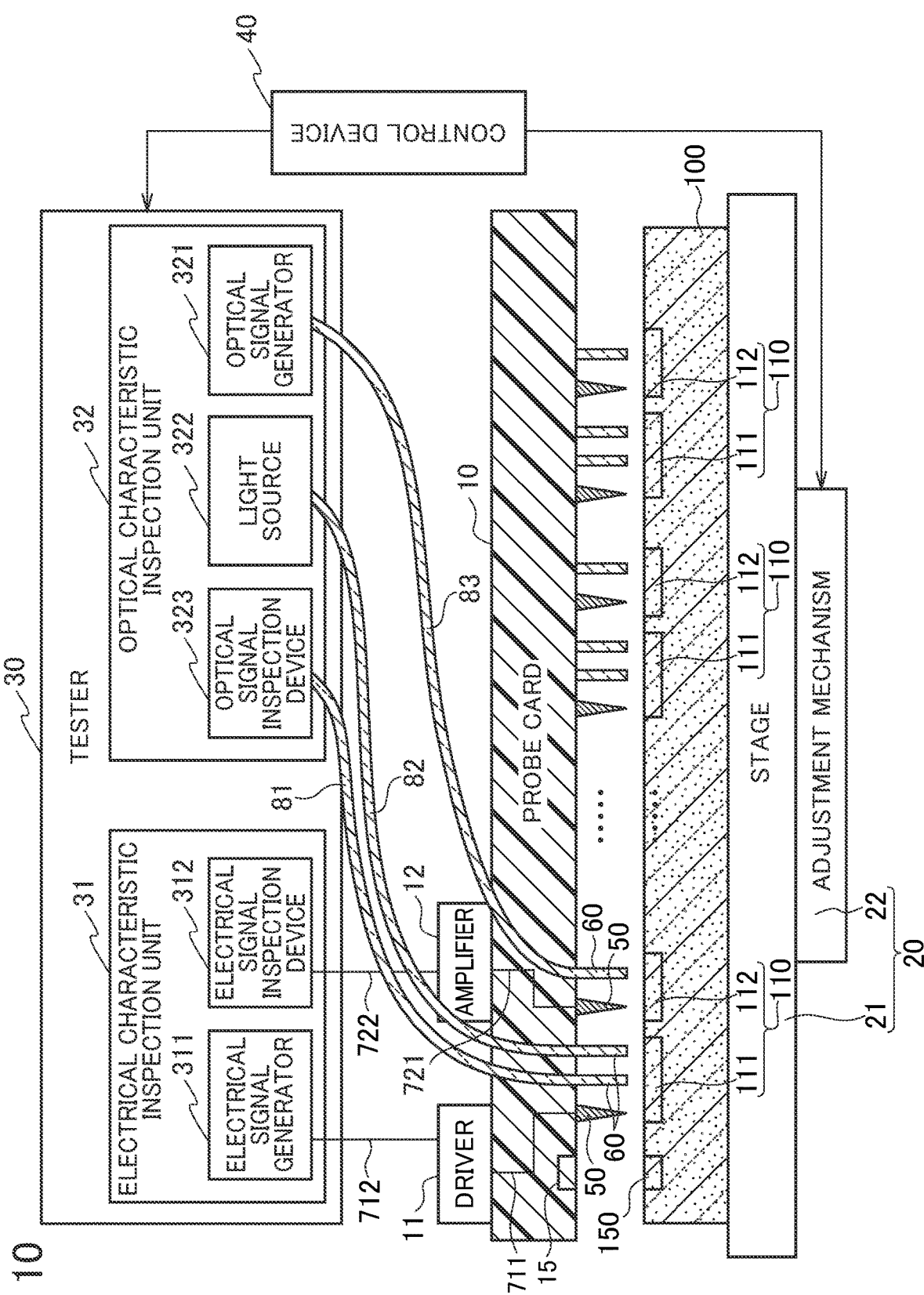
FIG. 10 is a schematic view illustrating a configuration of an inspection system according to a second embodiment of the present invention.

FIG. 10 is a view illustrating a configuration of an inspection system according to a second embodiment of the present invention. The inspection system according to the present embodiment differs from the inspection system illustrated in FIG. 1 in that the probe card 10 is not provided with the test input connector 61 or the test output connector 62. The inspection system illustrated in FIG. 10 thus does not include the optical waveguide component 84 or 85. The other configurations are the same as those in the first embodiment as illustrated in FIG. 1. An inspection method by use of the inspection system as illustrated in FIG. 10 is described below.

First, the inspection object 100 is mounted on the mount surface of the stage 21 of the prober 20 (step S10). The initial positioning is then executed by use of the wafer-side alignment mark 150 and the card-side alignment mark 15, for example (step S20).

The high-accuracy positioning is then executed as follows (step S30). First, the test input signal is input from the tester 30 to the monitoring element chosen from the plural optical devices 110 provided on the inspection object 100. For example, the optical characteristic inspection unit 32 inputs the test input signal to the optical signal terminal of the monitoring element. The monitoring element operates in response to the test input signal, and the test light output signal is output from the monitoring element. The test light output signal is then input to the tester 30 via the optical connector 60. The optical intensity of the test light output signal is measured by the optical characteristic inspection unit 32 (step S31). The connection conditions in which the optical intensity of the test light output signal is the predetermined determination value or greater are then extracted as the inspection conditions by the method as described above (step S32).

Thereafter, the control device 40 controls the tester 30 so as to inspect the optical device 110 under the inspection conditions (step S40). The inspection by use of the inspection system as illustrated in FIG. 10 thus ends.

The inspection method according to the second embodiment uses, as the monitoring element, the optical device 110 that receives the electrical signal or the optical signal, or both the electrical signal and the optical signal input thereto, and outputs the optical signal, for example.

As described above, the inspection method according to the second embodiment executes the high-accuracy positioning by use of the monitoring element chosen from the plural optical devices 110. The other steps are substantially the same as those in the first embodiment, and overlapping explanations are not repeated below. The inspection method according to the second embodiment can decrease the area of the inspection object 100 as compared with the inspection method of forming the monitoring element 160 outside the area in which the optical devices 110 are formed.

Other Embodiments

While the present invention has been described above by reference to the respective embodiments, it should be understood that the present invention is not intended to be limited to the descriptions and the drawings composing part of this disclosure. Various alternative embodiments, examples, and technical applications will be apparent to those skilled in the art according to this disclosure.

For example, the respective embodiments have been illustrated above with the case of inspecting the optical devices 110 by use of the probe card 10 having the area covering the entire surface of the inspection object 100. Alternatively, the probe card 10 having an area conforming to a size of a part of the inspection object 100, such as a size of each block as illustrated in FIG. 7, may be used so as to independently inspect the optical devices 110 in each block.

The optical signal output from the optical signal terminal of the inspection object 100 may be converted into the electrical signal and then input to the tester 30. Namely, the optical signal transmitted via the optical connector 60 optically connected to the optical signal terminal is converted into the electrical signal by a converting device. The converted electrical signal is input to the electrical signal inspection device 312 of the electrical characteristic inspection unit 31 so as to inspect the electrical characteristics. The converting device is mounted on the probe card 10, for example.

It should be understood that the present invention includes various embodiments not disclosed herein.

What is claimed is:

1. An inspection method for an inspection object provided with a semiconductor device including an electrical signal terminal to which an electrical signal is transmitted and an optical signal terminal to which an optical signal is transmitted, the method comprising:
    electrically connecting the electrical signal terminal of the semiconductor device to an electric connector, and optically connecting the optical signal terminal of the semiconductor device to an optical connector;
    measuring a test light output signal output from a monitoring element provided in the inspection object in response to a test input signal having been input to the monitoring element while adjusting a condition of a position and an inclination of the inspection object, and extracting a condition in which an optical intensity of the test light output signal is a predetermined determination value or greater as an inspection condition; and
    inspecting the semiconductor device under the inspection condition.

2. The inspection method according to claim 1, wherein a condition in which the optical intensity of the test light output signal is maximum during measuring under the condition while being adjusted is extracted as the inspection condition.

3. The inspection method according to claim 1, wherein a plurality of the semiconductor devices are simultaneously inspected under the inspection condition.

4. The inspection method according to claim 1, wherein the monitoring element is formed in a remaining part of a region of the inspection object in which the semiconductor device is provided.

5. The inspection method according to claim 4, wherein the monitoring element is an optical waveguide.

6. The inspection method according to claim 1, wherein the monitoring element is chosen from a plurality of the semiconductor devices provided in the inspection object.

7. The inspection method according to claim 1, wherein the monitoring element is arranged in each block of the inspection object divided into plural blocks, and the semiconductor device is separately inspected in each block.

8. The inspection method according to claim 1, wherein a probe card is used in which the electric connector and the optical connector are arranged so as to electrically connect the electrical signal terminal of the semiconductor device and the electric connector to each other and optically connect the optical signal terminal of the semiconductor device and the optical connector to each other.

9. The inspection method according to claim 1, wherein a prober is used on which the inspection object is mounted so as to electrically connect the electrical signal terminal of the semiconductor device and the electric connector to each other and optically connect the optical signal terminal of the semiconductor device and the optical connector to each other, the prober being configured to adjust the position and the inclination of the inspection object.

10. An inspection system used for inspecting an inspection object provided with a semiconductor device including a signal terminal group including an electrical signal terminal to which an electrical signal is transmitted and an optical signal terminal to which an optical signal is transmitted, the system comprising:
    a probe card provided therein with a connector group including an electric connector electrically connected to the electrical signal terminal of the semiconductor device and an optical connector optically connected to the optical signal terminal of the semiconductor device;
    a prober on which the inspection object is mounted, the prober being configured to adjust a position and an inclination of the inspection object so that the connector group is connected to the signal terminal group of the semiconductor device; and
    a tester configured to inspect a characteristic of the semiconductor device in accordance with the electrical signal and the optical signal transmitted via the connector group, wherein the inspection system is configured to:
  measure a test light output signal output from a monitoring element provided in the inspection object in response to a test input signal having been input to the monitoring element while adjusting a condition of the position and the inclination of the inspection object by the prober, and extracts a condition in which an optical intensity of the test light output signal is a predetermined determination value or greater as an inspection condition; and
  inspect the semiconductor device under the inspection condition.

11. The inspection system according to claim 10, wherein a condition in which the optical intensity of the test light output signal is maximum during measuring under the condition while being adjusted is extracted as the inspection condition.

12. The inspection system according to claim 10, wherein a plurality of the semiconductor devices are simultaneously inspected under the inspection condition.

13. The inspection system according to claim 10, wherein:
  the monitoring element is formed in a remaining part of a region of the inspection object in which the semiconductor device is provided; and
  a test input connector through which the test input signal is transmitted and a test output connector through which the test light output signal is transmitted are arranged in the probe card.

14. The inspection system according to claim 13, wherein the monitoring element is an optical waveguide.

15. The inspection system according to claim 10, wherein the monitoring element is chosen from a plurality of the semiconductor devices provided in the inspection object.

16. The inspection system according to claim 15, wherein:
  the tester includes an electrical characteristic inspection unit configured to inspect an electrical characteristic of the semiconductor device, and an optical characteristic inspection unit configured to inspect an optical characteristic of the semiconductor device;
  at least either the electrical characteristic inspection unit or the optical characteristic inspection unit inputs the test input signal to the monitoring element; and
  the optical characteristic inspection unit inspects the optical intensity of the test light output signal output from the monitoring element.

17. The inspection system according to claim 10, wherein the prober includes:
  a stage on which the inspection object is mounted; and
  an adjustment mechanism configured to adjust a position and an inclined angle of a mount surface of the stage on which the inspection object is mounted.

18. The inspection system according to claim 10, wherein a mount surface of the prober opposed to a rear surface of the inspection object is provided with a connector connected to a signal terminal provided on the rear surface of the inspection object.

* * * * *